(12) United States Patent
Chiang et al.

(10) Patent No.: US 10,553,655 B2
(45) Date of Patent: Feb. 4, 2020

(54) FORCE SENSOR DEVICE AND OLED DISPLAY DEVICE INCLUDING THE SAME

(71) Applicant: TPK Touch Solutions (Xiamen) Inc., Xiamen (CN)

(72) Inventors: Cheng-Chung Chiang, Kaohsiung (TW); Feng Chen, Fuzhou (CN); Wei Wei, Jianyang (CN); Tsai-Kuei Wei, Hsinchu County (TW); Ho-Hsun Chi, Hsinchu County (TW)

(73) Assignee: TPK Touch Solutions (Xiamen) Inc., Xiamen (CN)

( * ) Notice: Subject to any disclaimer, the term of this patent is extended or adjusted under 35 U.S.C. 154(b) by 0 days.

(21) Appl. No.: 15/872,916

(22) Filed: Jan. 16, 2018

(65) Prior Publication Data

US 2018/0204885 A1 Jul. 19, 2018

(30) Foreign Application Priority Data

Jan. 16, 2017 (CN) .......................... 2017 1 0029471

(51) Int. Cl.
*H01L 27/32* (2006.01)
*G06F 3/041* (2006.01)
*H01L 51/52* (2006.01)

(52) U.S. Cl.
CPC .......... *H01L 27/323* (2013.01); *G06F 3/0414* (2013.01); *H01L 51/529* (2013.01)

(58) Field of Classification Search
CPC .......... G06F 3/041; G06F 2203/04105; G06F 3/0414; H01L 51/529; H01L 27/323
See application file for complete search history.

(56) References Cited

U.S. PATENT DOCUMENTS

| | | | |
|---|---|---|---|
| 2016/0103545 A1* | 4/2016 | Filiz | G01L 1/18 345/174 |
| 2017/0250120 A1* | 8/2017 | Harauchi | H01L 23/36 |
| 2019/0196641 A1* | 6/2019 | Ryu | G06F 3/0414 |

* cited by examiner

*Primary Examiner* — Charles V Hicks
(74) *Attorney, Agent, or Firm* — Cooper Legal Group, LLC

(57) ABSTRACT

A force sensor device, which includes a force sensing layer, is provided, in which a heat treatment layer is disposed on one side of the force sensing layer, and a thermal conductivity of the heat treatment layer is greater than or equal to 200. An OLED display device includes an OLED layer and a CPU element, in which the force sensor device is disposed between the OLED layer and the CPU element. A heat treatment layer is disposed on at least one side of the force sensor device and the force sensing layer of the OLED display device. Heat distribution is relatively uniform through the heat treatment layer, so that a temperature gradient on the force sensing layer may be effectively decreased, the temperature noise in the press force detection may be decreased, and accuracy of pressure detection may be increased.

20 Claims, 7 Drawing Sheets

FORCE SENSOR DEVICE AND OLED DISPLAY DEVICE INCLUDING THE SAME

RELATED APPLICATIONS

This application claims priority to China Application Serial Number 201710029471.9, filed Jan. 16, 2017, which is herein incorporated by reference.

BACKGROUND

Technical Field

The present disclosure relates to a touch device. More particularly, the present disclosure relates to a force sensor device and an OLED display device.

Description of Related Art

Electronic equipment increasingly includes a force sensor device. Force sensor devices include pressure sensing units. When the pressure sensing units sense pressure of touch operations from users, the pressure sensing units are deformed, thereby changing electrical signal output of the pressure sensing units. A value of the electrical signal is detected and processed to obtain a pressure value applied on the pressure sensing units. Functions of the electronic equipment may be designed to match different pressure values obtained by detecting the pressure. For example, various functions may be mapped to the same touch position for different forces, such that the diversity of functions provided by electronic products may be increased, opening up new experiences for users.

Force sensor devices are typically made of piezoelectric material or piezoresistive material. Due to limitations of material properties, operation of the force sensor devices inevitably generates temperature noise due to ambient temperature. For example, the output signal of the pressure sensing units varies due to heat generated by commonly used pressing objects (e.g. fingers), central processing units (CPUs) of electronic equipment, and the like. As a result, pressure detection is inaccurate, and a real pressure value produced by user operation is difficult to determine accurately.

SUMMARY

The present disclosure provides a force sensor device and an OLED display device.

For the purpose of solving technical problems described above, an aspect of the present disclosure provides a force sensor device, which includes a force sensing layer. A heat treatment layer is disposed on at least one side of the force sensing layer. A thermal conductivity of the heat treatment layer is greater than or equal to 200.

According to an embodiment of the present disclosure, a direction perpendicular to a plane with the heat treatment layer is defined as Z-direction. A thermal conductivity of the heat treatment layer in the Z-direction is smaller than a thermal conductivity of the heat treatment in a direction of the plane with the heat treatment layer.

According to an embodiment of the present disclosure, the said thermal conductivity of the heat treatment layer in the Z-direction is at least smaller than 0.25 times of the thermal conductivity of the heat treatment layer in the direction of the plane with the heat treatment layer.

According to an embodiment of the present disclosure, the said heat treatment layer is selected from a group consisting of graphite sheets, graphene sheets, and copper sheets.

According to an embodiment of the present disclosure, the said heat treatment layer is grounded to function as a signal mask layer.

According to an embodiment of the present disclosure, one or plenty of the heat treatment layer(s) is/are disposed on one side or two sides of the force sensing layer.

According to an embodiment of the present disclosure, the said force sensor device further comprises a substrate and an adhering layer, in which the force sensing layer is disposed on the substrate. The heat treatment layer is disposed on a surface of the substrate away from the force sensing layer or a surface of the force sensing layer away from the substrate by the adhering layer.

According to an embodiment of the present disclosure, the said force sensor device further comprises a substrate, an adhering layer and a protective layer, in which the force sensing layer is disposed on the substrate. The protective layer covers a surface of the force sensing layer away from the substrate. The heat treatment layer is disposed on a surface of the protective layer away from the substrate by the adhering layer.

According to an embodiment of the present disclosure, the said force sensor device further comprises a substrate, a first adhering layer and a second adhering layer. The heat treatment layer includes a first heat treatment layer and a second heat treatment layer. The force sensing layer is disposed on the substrate. The first heat treatment layer is disposed on a surface of the force sensing layer away from the substrate by the first adhering layer. The second heat treatment layer is disposed on a surface of the substrate away from the force sensing layer by the second adhering layer.

According to an embodiment of the present disclosure, the force sensing layer includes pressure sensing units. Each of the pressure sensing units includes sub-pressure sensing units, and there is a differential output between the sub-pressure sensing units.

According to an embodiment of the present disclosure, each of the pressure sensing units includes four resistors with the same electrical resistance, and the resistors construct a Wheatstone bridge. Pattern shapes of two of the non-adjacent resistors have an identical first extending direction, and pattern shapes of another two of the non-adjacent resistors have an identical second extending direction. The first extending direction and the second extending direction are inconsistent.

According to an embodiment of the present disclosure, after the pattern shapes of the resistors with the first extending direction are rotated 90° in plane, the rotated pattern shapes are the same as or mirror-symmetric to the pattern shapes of the resistors with the second extending direction.

Another aspect of the present disclosure provides an OLED display device, which includes an OLED layer and a CPU element. The said force sensor device is disposed between the OLED layer and the CPU element.

According to an embodiment of the present disclosure, the said OLED display device further comprises a touch panel, in which the OLED layer is located between the touch panel and the force sensor device.

According to an embodiment of the present disclosure, the said OLED display device further comprises a touch electrode layer, in which the touch electrode layer is configured to sense a touch position, and the touch electrode layer is embedded in the OLED layer.

Compared to conventional techniques, the heat treatment layer is disposed on at least one side of the force sensing layer of the force sensor device and the force sensor device of the OLED display device of the present disclosure. Heat distribution is relatively uniform through the heat treatment layer. Therefore, a temperature gradient of the force sensing layer is effectively decreased, temperature noise produced in the press force detection progress is decreased, and pressure detection accuracy is increased.

BRIEF DESCRIPTION OF THE DRAWINGS

The disclosure can be more fully understood by reading the following detailed description of the embodiment, with reference made to the accompanying drawings as follows.

DETAILED DESCRIPTION

Reference will now be made in detail to the present embodiments of the disclosure, examples of which are illustrated in the accompanying drawings. It is to be understood that the following embodiments are provided to better elucidate the practice of the present disclosure and should not be interpreted in anyway as to limit the scope of same.

Figure 1:
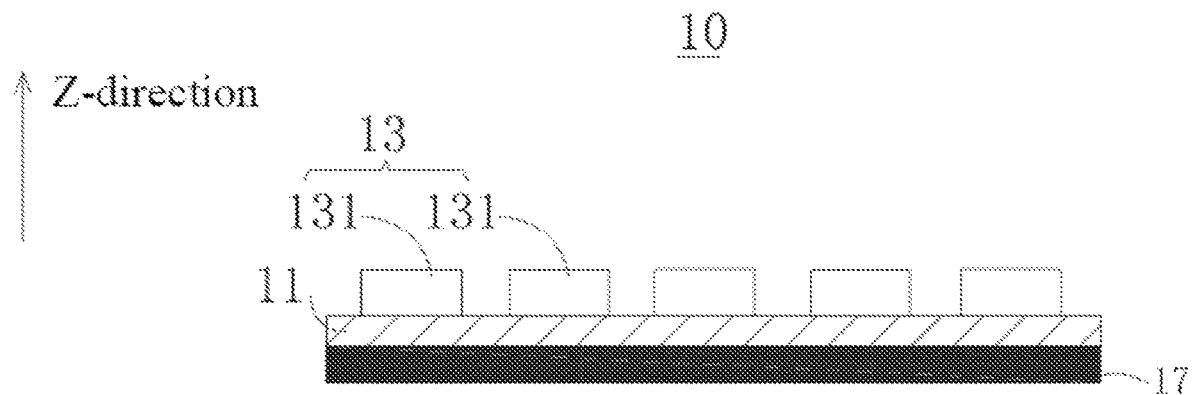
FIG. 1 is a cross-sectional structure diagram according to at least one embodiment of the present disclosure.

Referring to FIG. 1, a force sensor device 10 includes a substrate 11, in which a force sensing layer 13 is disposed on an upper surface of the substrate 11 (spatial terms, such as "up", "down", "left" and "right" involved in the present disclosure are relative positions of specific view. It is to be understood that, when a plane of the specific view rotates 180°, the spatial term "up" may become "down".). The force sensing layer 13, which includes at least one pressure sensing unit 131, takes the substrate 11 as a loading layer. A heat treatment layer 17 is disposed on a lower surface of the substrate 11, in which the heat treatment layer 17 is strip shaped. Preferably, the heat treatment layer 17 adjoins the lower surface of the substrate 11.

The substrate 11 may be a flexible substrate or a rigid substrate, such as glass, sapphire, polyimide (PI), polypropylene (PP), polystyrene (PS), Acrylonitrile-Butadiene-Styrene (ABS), polyethylene terephthalate (PET), polyvinyl chloride (PVC), polycarbonate (PC), polyethylene (PE), poly(methyl methacrylate) (PMMA), polytetrafluoroethylene (PTFE), or the like.

The heat treatment layer 17 has a good thermal conductive characteristics, and heat distribution is relatively uniform through the heat treatment layer 17. It is to be understood that, after heat is conducted to the heat treatment layer 17, heat is uniformly and rapidly distributed in a plane with the heat treatment layer 17, such that heat received by elements adjoining the heat treatment layer 17 is uniform. In an embodiment, the heat treatment layer 17 is disposed on one side of the force sensing layer 13 close to a heat source. In an embodiment, a thermal conductivity of the heat treatment layer 17 is greater than or equal to 200, and preferably greater than or equal to 1000. In an embodiment, the heat treatment layer 17 has different thermal conductivities in at least two different directions. A direction perpendicular to a plane with the heat treatment layer 17 is defined as Z-direction. In an embodiment, the thermal conductivity of the heat treatment layer 17 in the Z-direction is greater than the thermal conductivity of the heat treatment layer 17 in a direction perpendicular to the Z-direction. Since the thermal conductivity of the heat treatment layer 17 in the Z-direction is small, thermal conductive property is poor, and heat conduction in the Z-direction is suppressed; and the thermal conductive property is better in the direction perpendicular to the Z-direction so that heat may be well conducted in the plane perpendicular to the Z-direction. That is, heat is uniformly distributed in the plane with the heat treatment layer 17, such that heat received by elements adjoining the heat treatment layer 17 may be uniform. In an embodiment, the thermal conductivity of the heat treatment layer 17 in the Z-direction is at least smaller than 0.25 times the thermal conductivity of the heat treatment layer 17 in the direction perpendicular to the Z-direction, and preferably smaller than 0.1 times the thermal conductivity of the heat treatment layer 17 in the direction perpendicular to the Z-direction. In an example, the thermal conductivity of the heat treatment layer 17 in the Z-direction is smaller than or equal to 50, and the thermal conductivity of the heat treatment layer 17 in the direction perpendicular to the Z-direction is greater than or equal to 200. Preferably, the thermal conductivity of the heat treatment layer 17 in the Z-direction is smaller than or equal to 10, and the thermal conductivity of the heat treatment layer 17 in the direction perpendicular to the Z-direction is greater than or equal to 300. Further preferably, the thermal conductivity of the heat treatment layer 17 in the Z-direction is smaller than or equal to 8, and the thermal conductivity of the heat treatment layer 17 in the direction perpendicular to the Z-direction is greater than or equal to 800. In an embodiment, material of the heat treatment layer 17 is graphene sheets, graphite sheets or copper sheets, in which graphene sheets are preferable. In an embodiment, a thickness of the heat treatment layer 17 is 0.1 mm to 1 mm, and preferably is 0.4 mm to 0.6 mm.

The pressure sensing units 131 of the force sensing layer 13 are made of piezoelectric material or piezoresistive material, which may change electrical output according to the press force. The piezoresistive material is preferable. The force sensing layer 13 may be a single layer or multiple layers, and the present embodiment is discussed by using the single force sensing layer 13 as an example.

The heat treatment layer 17 is disposed on one side of the force sensing layer 13. Since the heat treatment layer 17 has a property of heat uniformity, temperature of various parts of each pressure sensing unit may become consistent. In a condition with the same material and temperature, temperature noise becomes consistent. In such case, the pressure sensing units 131 may be configured to output differential signals to eliminate the temperature noise, or the temperature noise generated in corresponding temperature may be eliminated by program calculation of program design. The present disclosure prefers disposal of the pressure sensing units 131 to output differential signals to eliminate the temperature noise. In order to obtain the differential signals, each pressure sensing unit 131 may be configured to include a plurality of substantially identical sub-pressure sensing units, in which the temperature noise between at least two sub-pressure sensing units 131 is offset to eliminate the effect of the temperature noise. Specifically, a plurality of sub-pressure sensing units may be disposed to be configured as a bleeder circuit, and four sub-pressure sensing units may also be disposed as a Wheatstone bridge or a suitable amount of sub-pressure sensing units may be constructed as bleeder circuits. The present embodiment is discussed in terms of using four sub-pressure sensing units to construct the Wheatstone bridge as an example.

Figure 2A:
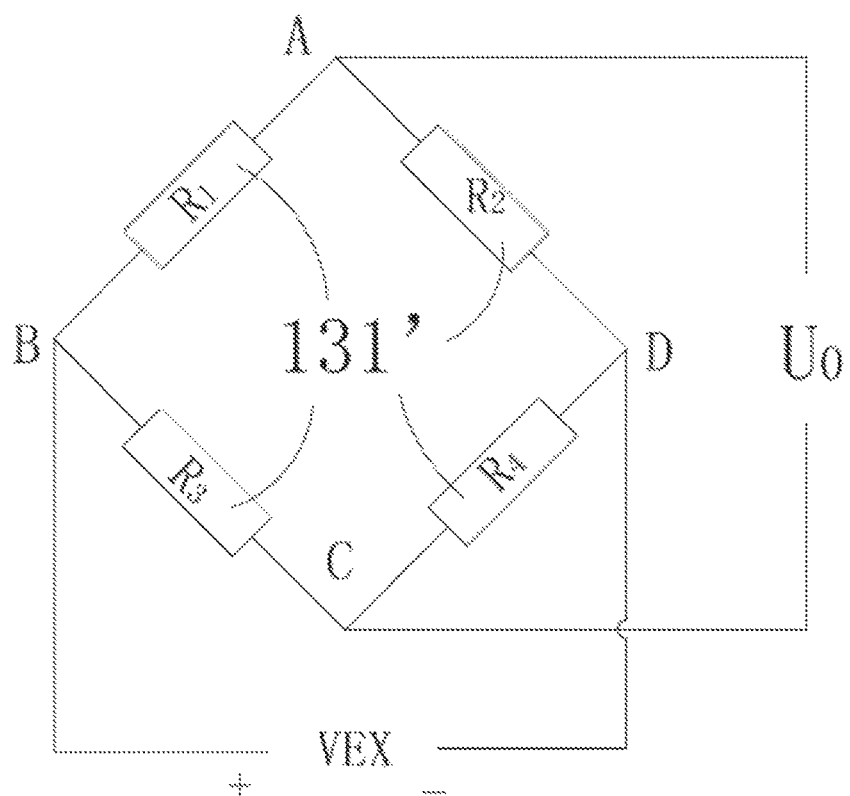
FIG. 2A is a circuit construction diagram of a pressure sensing units of the force sensor device according to at least one embodiment of the present disclosure.

Referring to FIG. 2A, each pressure sensing unit 131 includes four sub-pressure sensing units 131', and the sub-pressure sensing units 131' correspond to a resistor $R_1$, a resistor $R_2$, a resistor $R_3$, and a resistor $R_4$ with substantially identical electrical resistances. The four resistors are electrically connected as a bridge circuit. Specifically, the resistor $R_1$ is series connected to the resistor $R_2$, the resistor $R_3$ is series connected to the resistor $R_4$, and two series circuits are parallel connected to construct the Wheatstone bridge. Furthermore, a power supply VEX is applied between an electrical connection point B of the resistor $R_1$ and the resistor $R_3$ and an electrical connection point D of the resistor $R_4$ and the resistor $R_2$. Output voltage $U_0$ is generated between an electrical connection point A of the resistor $R_1$ and the resistor $R_2$ and an electrical connection point C of the resistor $R_3$ and the resistor $R_4$. The voltage $U_0$ corresponds to a value of the press force. In such case, voltage drop between two ends of the resistor $R_1$ may be represented as formula (1).

$$U_{AB} = I_1 R_1 = \frac{R_1}{R_1 + R_2} U_{BD} \qquad (1)$$

Voltage drop between two ends of the resistor $R_3$ may be represented as formula (2).

$$U_{BC} = \frac{R_3}{R_3 + R_4} U_{BD} \qquad (2)$$

Output voltage $U_0$ of the bridge circuit may be represented as formula (3).

$$U_0 = U_{AB} - U_{BC} = \frac{R_1 R_4 - R_2 R_3}{(R_1 + R_2)(R_3 + R_4)} U_{BD} \qquad (3)$$

In the present disclosure, the condition that $R_1 = R_2 = R_3 = R_4$ is substituted into the formula (3), and insignificant terms after substituting may be ignored to simplify the formula (3) to obtain formula (4).

$$U_0 = \frac{U_{BD}}{4} \left( \frac{\Delta R_1}{R_1} - \frac{\Delta R_2}{R_2} - \frac{\Delta R_3}{R_3} + \frac{\Delta R_4}{R_4} \right) \qquad (4)$$

A dependent variable relationship between a ratio of variation of resistance produced by pressing operation to an initial resistance of corresponding resistor and the resistor after pressing operation is represented as formula (5).

$$\Delta R/R = K\varepsilon \qquad (5)$$

In the formula (5), K represents piezoresistive coefficient of the resistor.

Combining the formulas (4) and (5) described above, voltage $U_0$ may be further represented as formula (6).

$$U_0 = \frac{U_{BD} K}{4} (\varepsilon_1 - \varepsilon_2 - \varepsilon_3 + \varepsilon_4) \qquad (6)$$

In the formula (6), K represents piezoresistive coefficient of the resistor, $U_{BS}$ represents a value of the power supply VEX applied between the electrical connection points B and D, and $\varepsilon_1$, $\varepsilon_2$, $\varepsilon_3$, and $\varepsilon_4$ are dependent variables corresponding to the resistors $R_1$, $R_2$, $R_3$, and $R_4$, respectively.

Figure 2B:
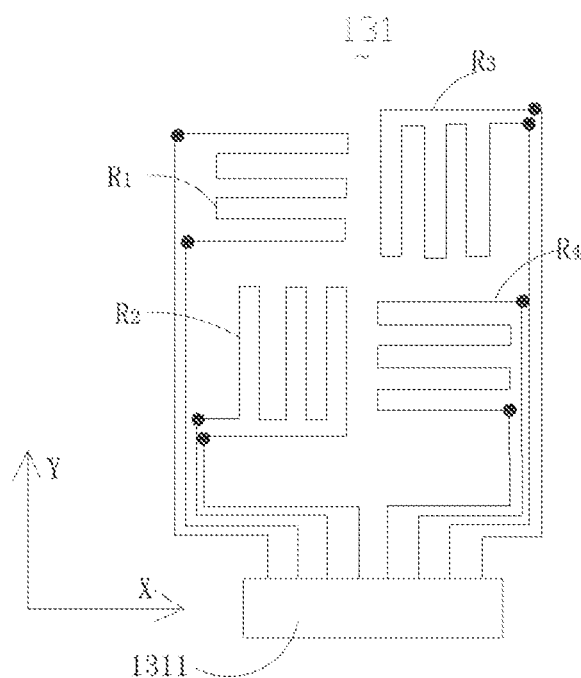
FIG. 2B is a pattern diagram of the pressure sensing units of the force sensor device according to at least one embodiment of the present disclosure.

Generally, it is desired to output voltage $U_0$ as high as possible. In this embodiment, in order to obtain the highest voltage $U_0$, it is preferable to have electrode pattern of the pressure sensing units 131 as shown in FIG. 2B. The resistors $R_1$, $R_2$, $R_3$, and $R_4$ are all in square-wave form. Pattern shapes of the resistors $R_1$ and $R_4$ both extend along a first direction (X-direction), and pattern shapes of the resistors $R_2$ and $R_3$ both extend along a second direction (Y-direction). The first direction is different from the second direction. The resistors $R_1$, $R_2$, $R_3$, and $R_4$ are connected to construct the Wheatstone bridge through a binding domain 1311.

Figure 2C:
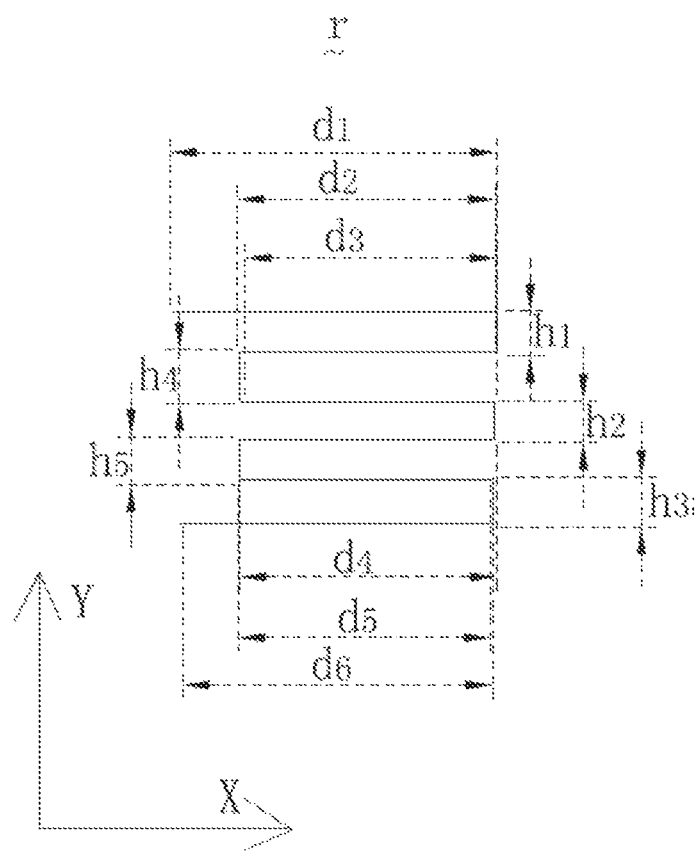
FIG. 2C is an analysis diagram of extending directions of resistors of the force sensor device according to at least one embodiment of the present disclosure.

The extending directions of the resistors are defined as below. Referring to FIG. 2C, resistor shown in FIG. 2C is marked as a resistor r, whose total projection length includes a total projection length d in the first direction and a total projection length h in the second direction. In such case, a resistor pattern shape is divided into multiple sections along the first direction or the second direction. The total projection length d along the first direction equals to a summation of a length d1, d2, d3, d4, d5 and d6, and the total projection length h along the second direction equals to a summation of length h1, h2, h3, h4 and h5. As known from FIG. 2C, the total projection length d along the first direction is greater than the total projection length h along the second direction. As a result, the extending direction of the electrode pattern shape of the resistor r is the first direction. Preferably, the projection length of the resistor r in the first direction is greater than 5 times the projection length of the resistor r in the second direction. Strain of the resistor r in its extending direction is much greater than strain in other directions. Therefore, it is known that the strain of the resistor r is similar to the strain in the extending direction.

Since the resistances of the said resistors $R_1$, $R_2$, $R_3$, and $R_4$ are the same, the extending directions of the pattern shapes of the resistors $R_1$ and $R_4$ are consistent, the extending directions of the pattern shapes of the resistors $R_2$ and $R_3$ are consistent, such that in the condition that resistance variation of the resistors $R_1$, $R_2$, $R_3$, and $R_4$ resulted from finger pressing force and temperature variation are the same, it is certified that the strain of the resistors $R_1$ and $R_4$ are consistent, and the strain of the resistors $R_2$ and $R_3$ are consistent. In other words, the strain relationship of the resistors $R_1$, $R_2$, $R_3$, and $R_4$ after finger pressing may be represented as: $\varepsilon_1 = \varepsilon_4 = \varepsilon_x$ and $\varepsilon_2 = \varepsilon_3 = \varepsilon_y$. As a result, the formula (6) described above may be further transformed into:

$$U_0 = \frac{U_{BD}K}{4}(\varepsilon_x - \varepsilon_y - \varepsilon_y + \varepsilon_x) = \frac{U_{BD}K}{2}(\varepsilon_x - \varepsilon_y) \tag{6}$$

In the formula (6), $\varepsilon_x$ represents the strain of the resistors $R_1$ and $R_4$ in the first direction, and $\varepsilon_y$ represents the strain of the resistors $R_2$ and $R_3$ in the second direction.

According to the formula (2), when the difference between $\varepsilon_x$ and $\varepsilon_y$ is greater, then the output value of voltage $U_0$ is greater, and the accuracy of pressure detection can be better. Therefore, preferably, the first direction is perpendicular to the second direction.

Figure 2D:
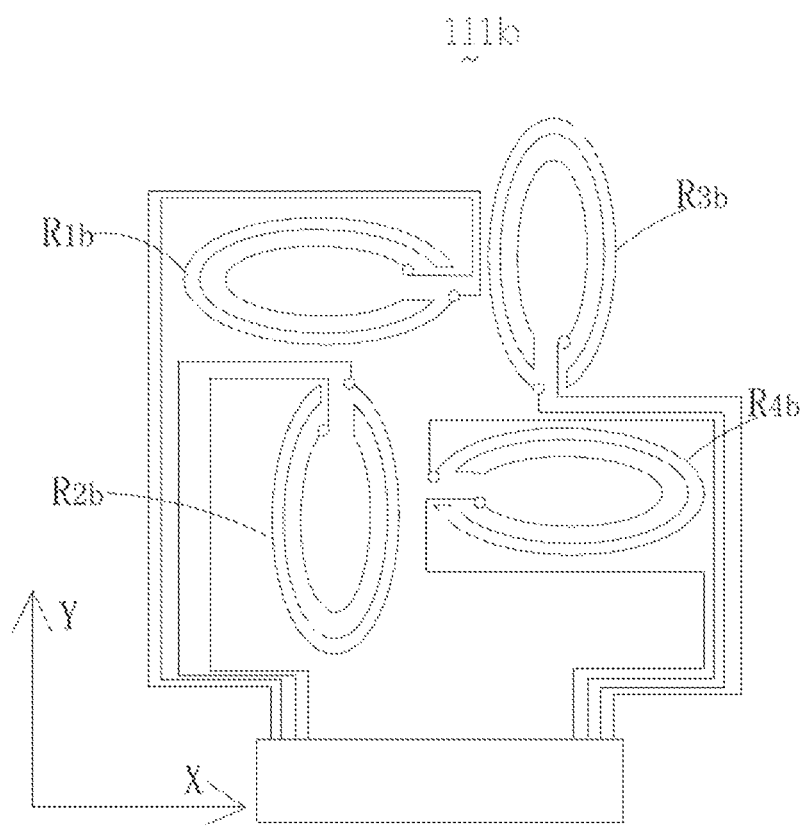
FIG. 2D is a transformed diagram of the pattern shape of the pressures sensing units in FIG. 2B.

Referring to FIG. 2D, which shows another transformation of the pressure sensing units 131, a bridge circuit 111b includes four resistors $R_{1b}$, $R_{2b}$, $R_{3b}$, and $R_{4b}$, in which a pattern shape of the four resistors is an ellipse coiling shape. A total projection length of the pattern shape in the ellipse coiling shape is greatest along the long-axis direction of the ellipse, so that the direction is an extending direction of the pattern shape. In such case, the extending directions of the pattern shapes of the resistor $R_{1b}$ and the resistor $R_{4b}$ are parallel with the first direction, and the extending directions of the pattern shape of the resistor $R_{2b}$ and the resistor $R_{3b}$ are parallel with the second direction.

In the present transformed embodiment, after the pattern shape plane of the resistor $R_{1b}$ or the resistor $R_{4b}$ extending along the first direction is rotated 90°, the pattern shape is the same as the pattern shape of the resistor $R_{2b}$ or the resistor $R_{3b}$ extending along the second direction, thereby maintaining stability of the Wheatstone bridge and simplifying process. As another transformation, after the pattern shape plane of the resistor $R_{1b}$ or the resistor $R_{1b}$ extending along the first direction is rotated 90°, the pattern shape is mirror-symmetric to the pattern shape of the resistor $R_{2b}$ or the resistor $R_{3b}$ extending along the second direction.

Figure 2E:
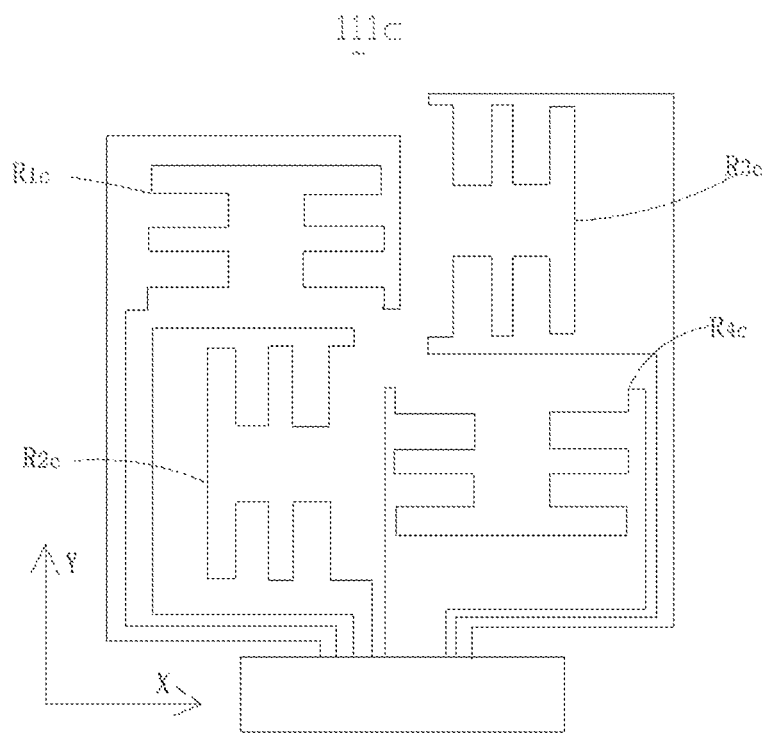
FIG. 2E is another transformed diagram of the pattern shape of the pressures sensing units in FIG. 2B.

As shown in FIG. 2E, as another transformation of the pressure sensing units 131, a bridge circuit 111c includes four resistors $R_{1c}$, $R_{2c}$, $R_{1c}$, and $R_{1c}$, in which a pattern shape of the four resistors is fence-shaped with a fold-line, such as a structure with three horizontal segments and one vertical segment. In such case, the extending directions of the pattern shapes of the resistor $R_{1c}$ and the resistor $R_{1c}$ are parallel with the first direction, and the extending directions of the pattern shapes of the resistor $R_{2c}$ and the resistor $R_{1c}$ are parallel with the second direction.

In some embodiments, specific shapes of the sub-pressure sensing units 131' of the pressure sensing units 131 are a wave shape, zigzag shape, or the like. Preferably, after the pattern shape of the resistors with a first extending direction is rotated 90°, the pattern shape is the same as or mirror-symmetric to the pattern shape of the resistor with a second extending direction.

Compared to the conventional technology, the heat treatment layer 17 is disposed on one side of the force sensing layer 13 of the force sensor device 10. Heat distribution is relatively uniform through the heat treatment layer 17. Therefore, a temperature gradient of the force sensing layer 13 is effectively decreased, temperature noise produced in the press force detection progress is decreased, and pressure detection accuracy is increased.

Figure 3:
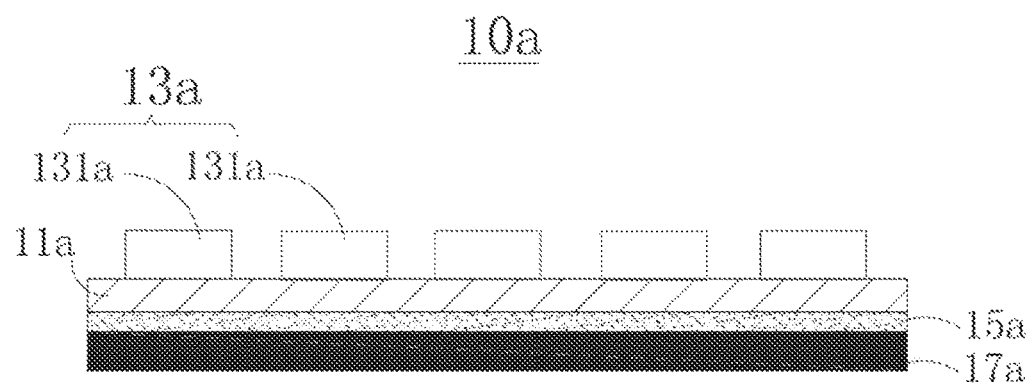
FIG. 3 is a cross-sectional structure diagram of a force sensor device according to at least one embodiment of the present disclosure.

Referring to FIG. 3, the force sensor device 10a is similar to the force sensor device 10, in that the force sensor device 10a also includes a substrate 11a, a force sensing layer 13a disposed on the substrate 11a, and a heat treatment layer 17a disposed underneath the substrate 11a, and the force sensing layer 13a includes a plurality of pressure sensing units 131a. In the force sensor device 10a of the present embodiment, the substrate 11a and the heat treatment layer 17a of the force sensor device 10a are attached through an added adhering layer 15a therebetween. Preferably, the adhering layer 15a covers at least the entire overlap of the substrate 11a and the heat treatment layer 17a. The adhering layer 15a is made of adhering material, and preferably is made of insulating optical clear adhesive. The heat treatment layer 17a is disposed on one side of the force sensing layer 13a. Specifically, the heat treatment layer 17a is fixed on one side of the substrate 11a through the adhering layer 15a. Therefore, binding between the heat treatment layer 17a, the substrate 11a and the force sensing layer 13a is more compact, and the temperature gradient between the pressure sensing units 131a may be further decreased.

Description of the force sensor device 10 regarding disposition of the force sensing layer 13, material dimensions of the substrate 11 and the heat treatment layer 17, and the like are all suitable for the present embodiment shown in FIG. 3.

Figure 4:
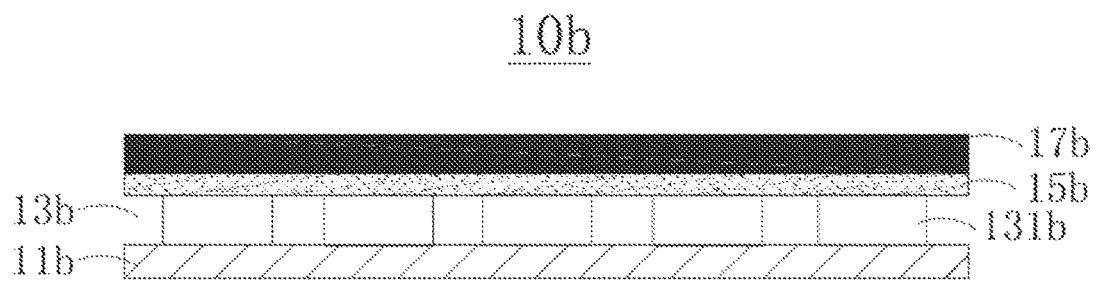
FIG. 4 is a cross-sectional structure diagram of a force sensor device according to at least one embodiment of the present disclosure.

Referring to FIG. 4, the force sensor device 10b is similar to the force sensor device 10, in that the force sensor device 10b includes a heat treatment layer 17b, a substrate 11b, and a force sensing layer 13b disposed on the substrate 11b, and the force sensing layer 13b includes a plurality of pressure sensing units 131b. The force sensor device 10b of the present embodiment is further configured such that the heat treatment layer 17b is disposed over the force sensing layer 13b, the force sensing layer 13b is attached with the heat treatment layer 17b through an added adhering layer 15b, and the adhering layer 15b covers at least the entire overlap of the force sensing layer 13b and the heat treatment layer 17b.

In some embodiments, the adhering layer 15b is made of insulating adhering material, and preferably is made of insulating optical clear adhesive. When the heat treatment layer 17b is made of conducting material, the adhering layer 15b is electrically insulated from the heat treatment layer 17b and the force sensing layer 13b. In some embodiments, thickness of the adhering layer 15b is 0.1 mm to 1 mm, and preferably is 0.4 mm to 0.8 mm.

The heat treatment layer 17b is disposed on one side of the force sensing layer 13b. Specifically, the heat treatment layer 17b is attached to one side of the force sensing layer 13b through the adhering layer 15b. Therefore, binding between the heat treatment layer 17b, the substrate 11b and the force sensing layer 13b is more compact, and the temperature gradient between the pressure sensing units 131b may be further decreased.

In a transformed example, the adhering layer 15b may be replaced with an insulating layer. The insulating layer has insulating effect, and the insulating layer is stacked between the force sensing layer 13b and the heat treatment layer 17b.

In a transformed example, the heat treatment layer 17b disposed on one side of the force sensing layer 13b is multi-layered, and the multi-layer heat treatment layer 17b is attached or closely stacked in between each other.

Description of the force sensor device 10 regarding disposition of the force sensing layer 13, material dimensions of the substrate 11 and the heat treatment layer 17, and the like are all suitable for the present embodiment.

Figure 5:
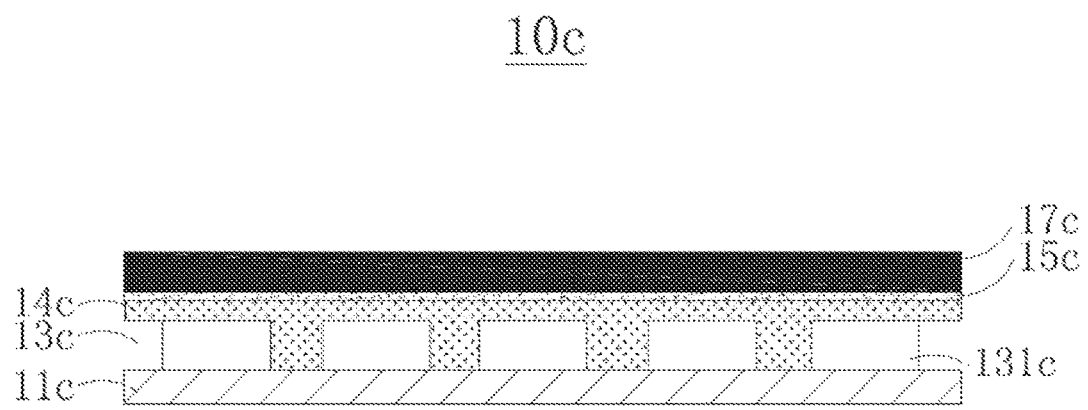
FIG. 5 is a cross-sectional structure diagram of a force sensor device according to at least one embodiment of the present disclosure.

Referring to FIG. 5, the force sensor device 10c is similar to the force sensor device 10b, in that the force sensor device 10c also includes a substrate 11c and a force sensing layer 13c disposed on the substrate 11c, and the force sensing layer 13c includes a plurality of pressure sensing units 131c. A heat treatment layer 17c and an adhering layer 15c are disposed over the force sensing layer 13c. The force sensor device 10c of the present embodiment further includes an integrally formed protective layer 14c (or simply "the protective layer 14c" hereafter). The protective layer 14c covers a surface of the force sensing layer 13c away from the substrate 11c, thereby protecting the force sensing layer 13c and preventing the pressure sensing units 131c from being oxidized and broken. The heat treatment layer 17c is attached with a surface of the protective layer 14c away from the substrate 11c, and the attachment is preferable to be entire attachment.

The protective layer 14c not only protects the force sensing layer 13c, but also electrically isolates the heat treatment layer 17c from the force sensing layer 13c. Preferably, the protective layer 14c is made of soft insulating flexible material, such as PEEK (polyetheretherketone), PI (polyimide), PET (polyethylene terephthalate), PC (polycarbonate), PES (polyethylene succinate), PMMA (polymethylmethacrylate), or any combination including any two or more thereof.

The protective layer 14c and the adhering layer 15c both have insulating effect. As a result, a thickness of the adhering layer 15c may be decreased, and preferably, the thickness of the adhering layer may be in a range of about 0.01 mm to about 0.2 mm.

The description of force sensor device 10 regarding disposition of the force sensing layer 13, material dimensions of the substrate 11 and the heat treatment layer 17, and the like are all suitable for the present embodiment.

Figure 6:
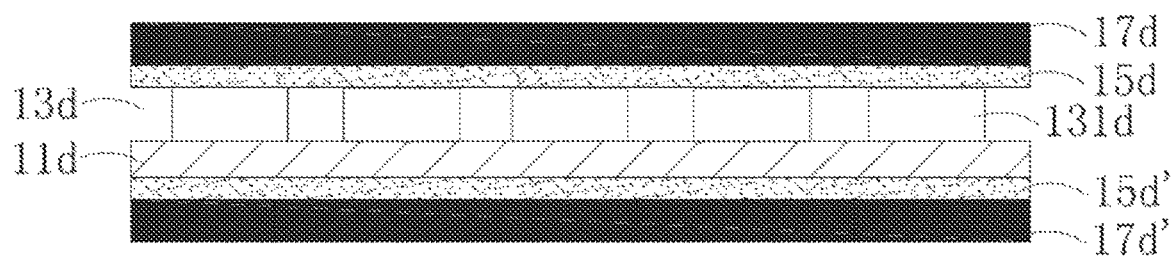
FIG. 6 is a cross-sectional structure diagram of a force sensor device according to at least one embodiment of the present disclosure.

Referring to FIG. 6, a force sensor device 10d is similar to the force sensor device 10a. The force sensor device 10d of the present embodiment further includes a heat treatment layer and an adhering layer based on the force sensor device 10a. Therefore, the force sensor device 10d includes a first heat treatment layer 17d, a first adhering layer 15d, a force sensing layer 13d including plenty of pressure sensing units 131d, a substrate 11d, a second adhering layer 15d' and a second heat treatment layer 17d' in order from top to bottom. The substrate 11d is disposed as a carrier layer of the force sensing layer 13d. The first heat treatment layer 17d is attached to an upper surface of the force sensing layer 13d through the first adhering layer 15d, and the second heat treatment layer 17d' is attached to a lower surface of the substrate 11d through the second adhering layer 15d'. The attachment is preferably entire attachment.

The first adhering layer 15d is made of insulating adhering materials. The second adhering layer 15d' is made of adhering materials, and insulating adhering materials are preferable. The first adhering layer 15d and the second adhering layer 15d' cause binding between the heat treatment layers (including the first heat treatment layer 17d and the second heat treatment layer 17d') and the force sensing layer 13d to be more compact.

The heat treatment layers 17d, 17d' are disposed on both sides of the force sensing layer 13d. The heat treatment layers 17d, 17d' cause heat distribution from the upper surface and the lower surface of the force sensing layer 13d to be more uniform, and a temperature gradient of the force sensing layer 13d is further decreased.

In a transformed example, the second adhering layer 15d' may be eliminated, and the second heat treatment layer 17d' is stacked directly and closely with the lower surface of the substrate 11d. In another transformed example, the first adhering layer 15d may be replaced with an insulating layer, and the insulating layer is stacked between the force sensing layer 13d and the first heat treatment layer 17d.

In a transformed example, the heat treatment layers on two sides of the force sensing layer 13d may be multi-layered.

The description of the force sensor device 10 regarding disposition of the force sensing layer 13, material dimensions of the substrate 11 and the heat treatment layer 17, and the like are all suitable for the present embodiment.

Figure 7:
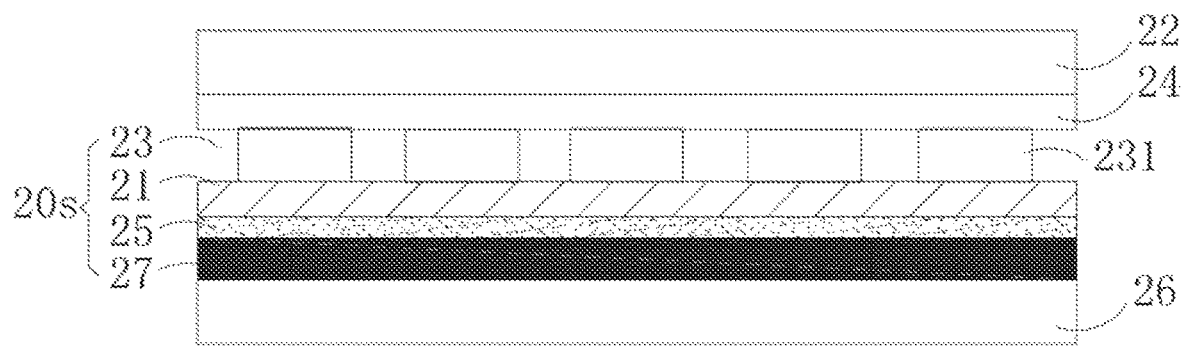
FIG. 7 is a cross-sectional structure diagram of an OLED display device according to at least one embodiment of the present disclosure.

Referring to FIG. 7, an OLED display device 20 includes a cover plate 22, an OLED layer 24, a force sensor device 20s and a central processing unit ("CPU") element 26 in order from top to bottom.

An upper surface of the cover plate 22 is a user touch operation plane. When a touch operation is performed, the force sensor device 20s is disposed below the touch operation plane, and the force sensor device 20s senses press force corresponding to the touch operation. The OLED layer 24 and the force sensor device 20s are electrically connected to the CPU element 26, and the CPU element 26 controls operation of the OLED display device 20.

The force sensor device 20s is consistent in structure and material parameters to the force sensor device 10a. Likewise, the force sensor device 20s includes a force sensing layer 23 comprising a plurality of pressure sensing units 231. The force sensing layer 23 is disposed on a surface of the substrate 21, and another surface of the substrate 21 is attached to a heat treatment layer 27 through an adhering layer 25. The force sensing layer 23 is located between the OLED layer 24 and the substrate 21.

In some embodiments, when the heat treatment layer 27 is made of conducting material, the heat treatment layer 27 is grounded and functions as a signal mask layer to block disturbing signals from the CPU element 26. The implementation is suitable for other embodiments of the present disclosure, as well.

It is understood that the force sensor device 20s of the present embodiment may be replaced with the force sensor device of other embodiments and transformed embodiments of the present disclosure.

The CPU element 26 is a control center of the OLED display device 20, which tends to act as a point heat source in operation progress. After heat crosses the heat treatment layer 27 disposed over the CPU element 26, heat distribution on the heat treatment layer 27 is relatively uniform. As a result, the force sensing layer 23 disposed over the heat treatment layer 27 is heated uniformly, temperature gradient decreases, temperature noise produced in the press force detection progress decreases, and pressure detection accuracy increases. It is understood that the heat treatment layer 27 is not only used to treat heat from the CPU element 26, but heat conducted from any direction may also be treated by the heat treatment layer 27 so as to obtain uniform heat distribution property.

Figure 8:
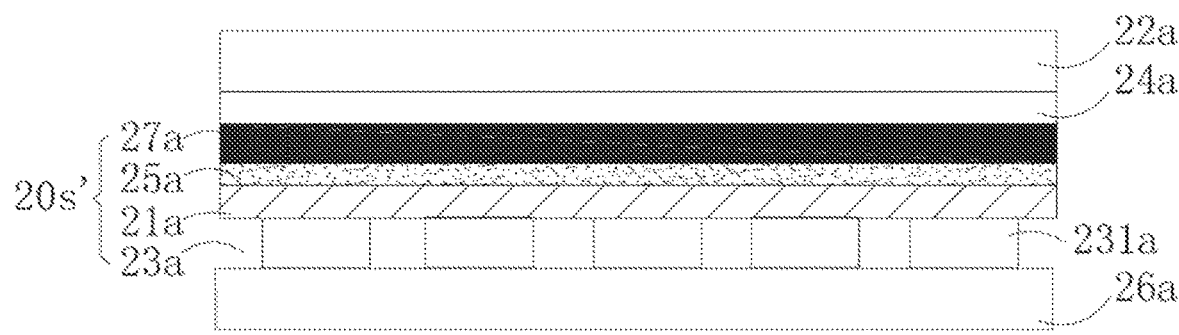
FIG. 8 is a cross-sectional structure diagram of an OLED display device according to at least one embodiment of the present disclosure.

Referring to FIG. 8, the OLED display device 20a includes a cover plate 22a, an OLED layer 24a, a force sensor device 20s' and a CPU element 26a in order from top to bottom. The force sensor device 20s' is consistent in structure and material parameters to the force sensor device 10a. Likewise, the force sensor device 20s' includes a force sensing layer 23a comprising a plurality of pressure sensing units 231a. The force sensing layer 23a is disposed on a surface of the substrate 21a, and another surface of the substrate 21a is attached with a heat treatment layer 27a through an adhering layer 25a. The difference between the OLED display device 20a of the present embodiment and the OLED display device 20 concerns assembly of the force sensor device 20s'. In some embodiments, the force sensing layer 23 is located between the OLED layer 24 and the substrate 21. In the present embodiment, the force sensor device 20s' is formed equivalent to the force sensor device 20s after rotating 180° within a plane. As a result, the force sensing layer 23a is located between the CPU element 26a and the substrate 21a, and the heat treatment layer 27a is disposed between the OLED layer 24a and the adhering layer 25a.

It is understood that the force sensor device 20s' may be changed to the force sensor device of another embodiments and transformed embodiments of the present disclosure, and the force sensor device may be rotated 180° to be formed in two different ways.

Figure 9:
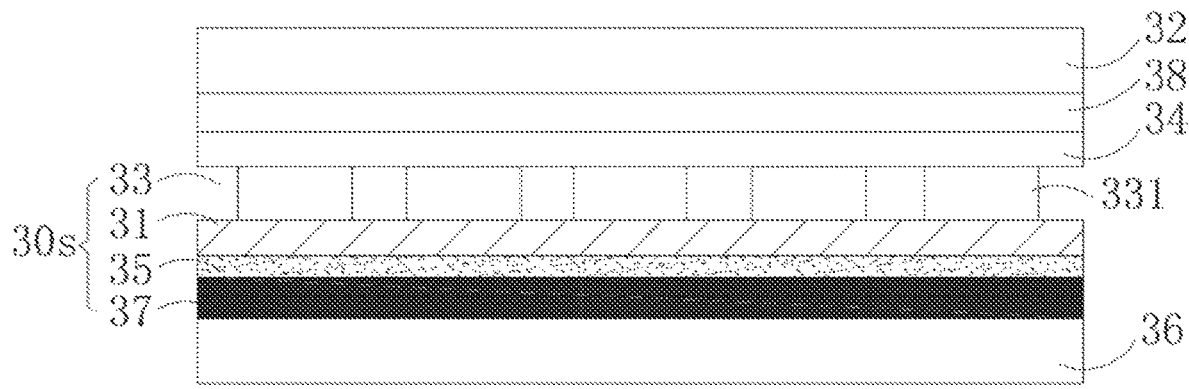
FIG. 9 is a cross-sectional structure diagram of an OLED display device according to at least one embodiment of the present disclosure.

Referring to FIG. 9, the OLED display device 30 includes a cover plate 32, a touch sensing layer 38, an OLED layer 34, a force sensor device 30s and a CPU element 36 in order from top to bottom. The force sensor device 30s is consistent in structure and material parameters to the force sensor device 10a. Likewise, the force sensor device 30s includes a force sensing layer 33 comprising a plurality of pressure sensing units 331. The force sensing layer 33 is disposed on a surface of the substrate 31, and another surface of the substrate 31 is attached with a heat treatment layer 37 through an adhering layer 35. The force sensing layer 33 is located between the OLED layer 34 and the substrate 31.

The difference between the present embodiment and this embodiment is that the touch sensing layer 38 is added between the cover plate 32 and the OLED layer 34, in which the touch sensing layer 38 is used to sense a position touched by a user. The touch sensing layer 38 and the cover plate 32 are considered to be a touch panel, and the touch panel may be a one-glass-solution (OGS) touch panel, a glass-film-film (GFF) touch panel, glass-film (GF) touch panel or glass-two-sided-film (G2F) touch panel. In other words, the touch panel is a plug-in structure. In a transformed example, the touch panel may also be an embedded structure; that is, the touch sensing layer is embedded in the OLED layer.

It is understood that the force sensor device 30s may be replaced with the force sensor device of another embodiments and transformed embodiments of the present disclosure, and the force sensor device may be rotated 180° to be formed in two different ways.

Compared to the conventional technique, the heat treatment layer 37 is disposed on one side of the force sensing layer 33 of the OLED display device. The heat treatment layer 37 makes received heat uniform to decrease temperature gradient of the force sensing layer 33, resulting in decreasing temperature noise produced in the press force detection progress, and further increasing accuracy of pressure detection.

The present disclosure provides a special OLED display device and the OLED display device provided in the present disclosure (particularly, the OLED display device of the eighth embodiment of the present disclosure) in the same dimension, and both are tested in conditions of different temperatures. The difference between the special OLED display device and the OLED display device provided in the present disclosure is that no heat treatment layer is disposed on the special OLED display device, and the other dispositions are consistent.

Test 1

Figure 10:
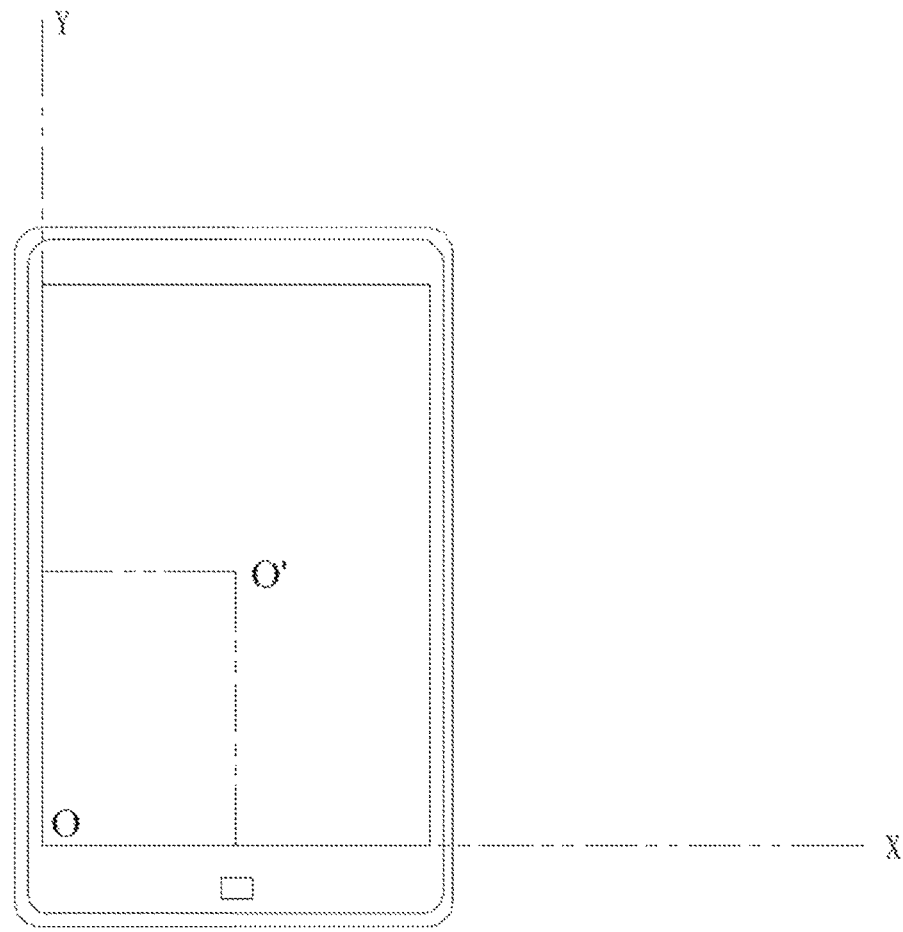
FIG. 10 is a plane structure diagram of a display plane of the OLED display device.

Referring to FIG. 10, an X-Y coordinate system is established by taking lower left corner of a display region of the OLED display device as a point of origin O. Dimension of the display region is 100 mm*60 mm. A center position of the display region is defined as O' point, and coordinate of the O' point is (30 mm, 50 mm). Touch operation is carried out at the O' point to perform test.

Figure 11:
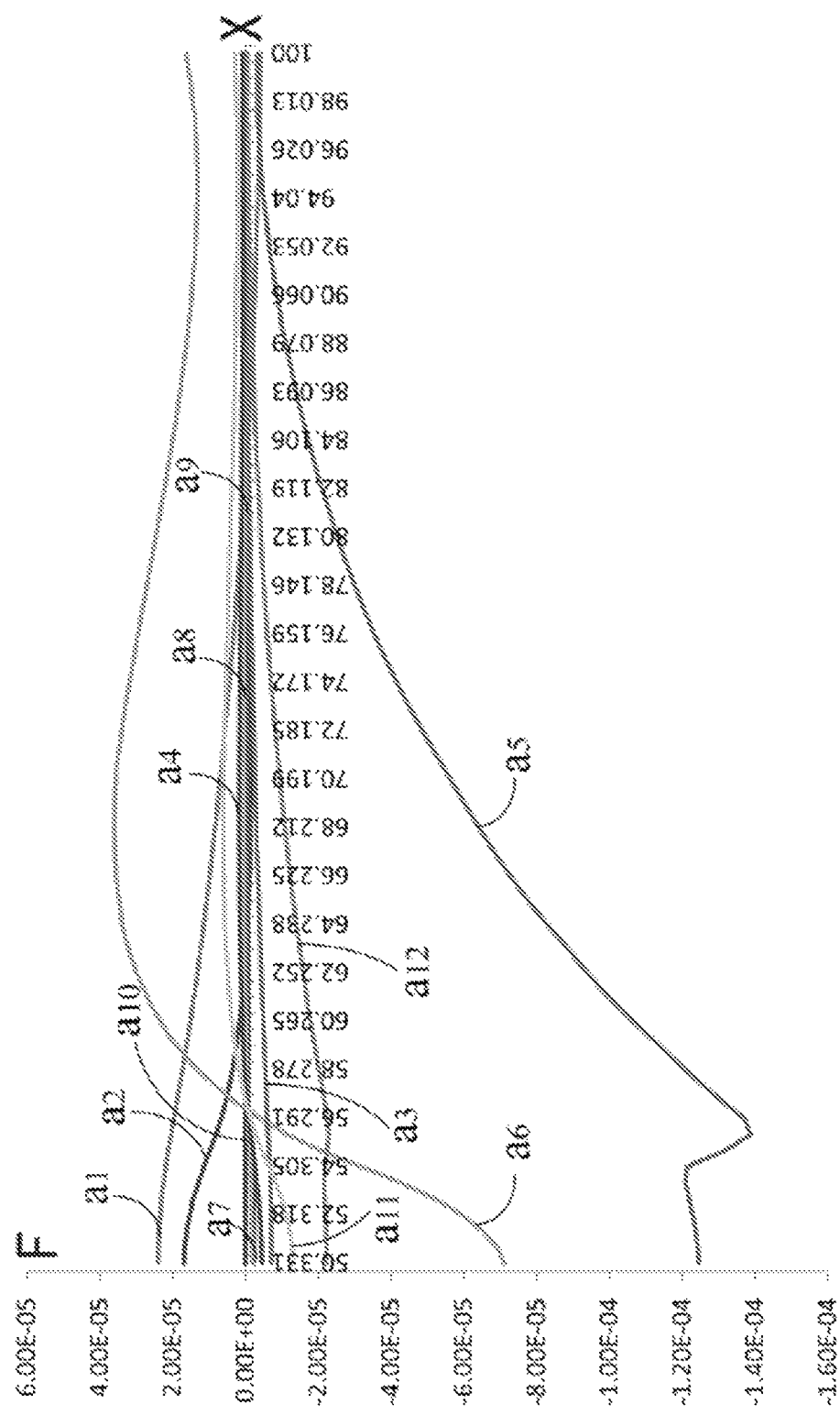
FIG. 11 is a pressure variation correlation graph of a conventional OLED display device and an OLED display device of the present disclosure in different test condition.

FIG. 11 is a comparison graph of tests in different conditions of the special OLED display device and the OLED display device provided by the present disclosure. In the comparison graph, an X-direction of the OLED display device is taken as a transverse axis, and a pressure value detected by the pressure sensing units on the force sensing layer is taken as a longitudinal axis.

Test A

Test subject: Special OLED display device

Test conditions: 200 unit force is applied at the O' point (FIG. 10) at ambient temperature.

Test results: Profiles a1 and a2 (FIG. 11) are pressure values detected by the pressure sensing units along the X-direction of the special OLED display device, in which the profile a1 depicts the pressure values detected by the resistor with the first extending direction of the pressure sensing units, and the profile a2 depicts the pressure values detected by the resistor with the second extending direction of the pressure sensing units. From variation of the profiles, the pressure values detected by the pressure sensing units of the special OLED display device decrease gradually from a pressing position to a position away from the pressing position.

Test B

Test subject: Special OLED display device

Test conditions: No press force is applied at a constant temperature of 65° C.

Test results: Profiles a3 and a4 (FIG. 11) depict pressure values detected by the pressure sensing units along the X-direction of the special OLED display device, in which the profile a3 depicts the pressure values detected by the resistor with the first extending direction of the pressure sensing units, and the profile a4 depicts the pressure values detected by the resistor with the second extending direction of the pressure sensing units. From variation of the profiles, it is observed that the profiles a3 and a4 are close to the transverse axis. In other words, at the constant temperature, output of the pressure sensing units is substantially 0, indicating that temperature noise of the pressure sensing units is substantially 0 at the constant temperature condition.

Test C

Test subject: Special OLED display device

Test conditions: No press force is applied at a temperature gradient of 22° C. to 65° C.

Test results: Profiles a5 and a6 (FIG. 11) depict pressure values detected by the pressure sensing units along the X-direction of the special OLED display device, in which the profile a5 depicts the pressure values detected by the resistor with the first extending direction of the pressure sensing units, and the profile a6 depicts the pressure values detected by the resistor with the second extending direction of the pressure sensing units. From variation of the profiles, although no press force is applied on the special OLED display device, the pressure values detected by the resistors with the first extending direction and the second extending direction of the pressure sensing units are even higher than the pressure values of the profiles a1 and a2 corresponding to application of 200 units force. In other words, when the temperature gradient is greater, the temperature noise produced by the pressure sensing units is so great that a larger pressure detection error is caused.

Test D

Test subject: The OLED display device provided by the present disclosure, in which the heat treatment layer of the OLED display device is made of graphene (thermal conductivity of graphene at a plane with the heat treatment layer is greater than or equal to 1000).

Test conditions: No press force is applied at a temperature gradient of 22° C. to 65° C.

Test results: Profiles a7 and a8 (FIG. 11) depict pressure values detected by the pressure sensing units along the X-direction of the OLED display device provided by the present disclosure, in which the profile a7 depicts the pressure values detected by the resistor with the first extending direction of the pressure sensing units, and the profile a8 depicts the pressure values detected by the resistor with the second extending direction of the pressure sensing units. From variation of the profiles, it is observed that the profiles a7 and a8 are close to the transverse axis. In a condition with the heat treatment layer added, although the temperature gradient is greater, output of the pressure sensing units is substantially 0. Therefore, the disposition of the heat treatment layer made of graphene material makes the temperature noise produced by the pressure sensing units decrease, and accuracy of the pressure detection is increased.

Test E

Test subject: The OLED display device provided by the present disclosure, in which the heat treatment layer of the OLED display device is made of graphite sheet (thermal conductivity of graphite sheet at a plane with the heat treatment layer is greater than or equal to 200).

Test conditions: No press force is applied at a temperature gradient of 22° C. to 65° C.

Test results: Profiles a9 and a10 (FIG. 11) depict pressure values detected by the pressure sensing units along the X-direction of the OLED display device provided by the present disclosure, in which the profile a9 depicts the pressure values detected by the resistor with the first extending direction of the pressure sensing units, and the profile a10 depicts the pressure values detected by the resistor with the second extending direction of the pressure sensing units. From variation of the profiles, it is observed that the profiles a9 and a10 are close to the transverse axis. In a condition with the heat treatment layer added, although the temperature gradient is greater, output of the pressure sensing units is substantially 0. In other words, in a condition of greater temperature gradient, the temperature noise of the pressure sensing units is substantially 0. Therefore, the disposition of the heat treatment layer made of graphite sheet material causes the temperature noise produced by the pressure sensing units to decrease, and accuracy of the pressure detection is increased.

Test F

Test subject: The OLED display device provided by the present disclosure, in which the heat treatment layer of the OLED display device is made of iron sheet (thermal conductivity of iron sheet at a plane with the heat treatment layer is about 70).

Test conditions: No press force is applied at a temperature gradient of 22° C. to 65° C.

Test results: Profiles a11 and a12 (FIG. 11) depict pressure values detected by the pressure sensing units along the X-direction of the OLED display device provided by the present disclosure, in which the profile a11 depicts the pressure values detected by the resistor with the first extending direction of the pressure sensing units, and the profile a12 depicts the pressure values detected by the resistor with the second extending direction of the pressure sensing units. From variation of the profiles, it is observed that the pressure value detected by the resistor with the first extending direction is about 200 unit force, and the pressure value detected by the resistor with the second extending direction is about 100 unit force. In other words, at a temperature gradient of 22° C. to 65° C., the pressure sensing units still produce the temperature noise. However, compared to the Test C, the disposition of the heat treatment layer suppresses the production of the temperature noise to a certain extent. Compared to the Test D and Test E, it can be seen that suppression of the temperature noise is the best when the heat treatment layer is made of graphene material (profiles a7 and a8).

Test 2

The special OLED display device and the OLED display device provided by the present disclosure are heated from room temperature to 95° C. by using a gas blower. The test is repeated for five cycles. Output variation of the special OLED display device and the OLED display device provided by the present disclosure are shown below.

TABLE 1

|  | Number of experiments | | | | |
| --- | --- | --- | --- | --- | --- |
| Type | 1 | 2 | 3 | 4 | 5 |
| Output of the special OLED display device (mV) | 0.09 | 0.2 | 0.07 | 0.02 | 0.12 |
| Output of the OLED display device provided by the present disclosure (mV) | 0.02 | 0.017 | 0.02 | 0.02 | 0.02 |

It is observed from Table 1 above that in a condition of abrupt change in temperature, the output signal of the pressure sensing units of the special OLED display device is obviously greater than the output signal of the pressure sensing units of the OLED display device provided by the present disclosure. Moreover, the output signal of the pressure sensing units of the OLED display device provided by the present disclosure tends toward stability. Hence it is known that the temperature noise of the force sensing layer of the OLED display noise with the added heat treatment layer decreases, and the accuracy of the pressure detection increases.

Descriptions above are merely the better embodiments of the present disclosure and are not intended to limit the present disclosure. Various modifications, equivalent replacement and improvement may be made based on the principle of the present disclosure while not departing from the scope of the disclosure.

What is claimed is:

1. A force sensor device, comprising:
a force sensing layer, wherein:
the force sensing layer comprises a plurality of pressure sensing units,
each pressure sensing unit of the plurality of pressure sensing units comprises a plurality of sub-pressure sensing units,
a first sub-pressure sensing unit of the plurality of sub-pressure sensing units has a longest dimension extending in a first direction, a second sub-pressure sensing unit of the plurality of sub-pressure sensing units has a longest dimension extending in a second direction different than the first direction, and there is a differential output between the plurality of sub-pressure sensing units; and a first heat treatment layer disposed on at least one side of the force sensing layer and configured to direct heat away from the force sensing layer, wherein the first heat treatment layer is selected from a group consisting of graphite sheets, graphene sheets, and copper sheets.

2. The force sensor device of claim 1, wherein:

the force sensing layer and the first heat treatment layer are stacked in a third direction orthogonal to the first direction, and a thermal conductivity of the first heat treatment layer in the third direction is less than a thermal conductivity of the first heat treatment layer in the first direction.

3. The force sensor device of claim 2, wherein the thermal conductivity of the first heat treatment layer in the third direction is less than about 0.25 times the thermal conductivity of the first heat treatment layer in the first direction.

4. The force sensor device of claim 1, wherein the first heat treatment layer is grounded to function as a signal mask layer.

5. The force sensor device of claim 1, further comprising:

a second heat treatment layer, wherein the force sensing layer is disposed between the first heat treatment layer and the second heat treatment layer.

6. The force sensor device of claim 1, further comprising:

a substrate; and an adhering layer, wherein:

the force sensing layer is disposed on the substrate, and either:

the first heat treatment layer is adhered to a surface of the substrate facing away from the force sensing layer by the adhering layer, or the first heat treatment layer is adhered to a surface of the force sensing layer facing away from the substrate by the adhering layer.

7. The force sensor device of claim 1, further comprising:

a substrate;

an adhering layer; and a protective layer, wherein:

the force sensing layer is disposed on the substrate, the protective layer covers a surface of the force sensing layer facing away from the substrate, and the first heat treatment layer is adhered to a surface of the protective layer facing away from the substrate by the adhering layer.

8. The force sensor device of claim 1, further comprising:

a substrate;

a first adhering layer;

a second adhering layer; and a second heat treatment layer, wherein:

the force sensing layer is disposed on the substrate, the first heat treatment layer is adhered to a surface of the force sensing layer facing away from the substrate by the first adhering layer, and the second heat treatment layer is adhered to a surface of the substrate facing away from the force sensing layer by the second adhering layer.

9. The force sensor device of claim 1, wherein:

each of the plurality of sub-pressure sensing units consists of four sub-pressure sensing units, each of the four sub-pressure sensing units defines a resistor, each of the four sub-pressure sensing units has a same electrical resistance, the four sub-pressure sensing units construct a Wheatstone bridge, the first sub-pressure sensing unit and a third sub-pressure sensing unit of the four sub-pressure sensing units have a longest dimension extending in the first direction, and the second sub-pressure sensing unit and a fourth sub-pressure sensing unit of the four sub-pressure sensing units have a longest dimension extending in the second direction.

10. The force sensor device of claim 1, wherein:

the first sub-pressure sensing unit has a first length, measured in the first direction at a first location, the first sub-pressure sensing unit has a second length, measured in the first direction at a second location different than the first location, and the first length is different than the second length.

11. An organic light-emitting diode (OLED) display device, comprising:

an OLED layer;

a central processing unit (CPU) element; and a force sensor device comprising:

a force sensing layer, wherein:

the force sensing layer comprises a plurality of pressure sensing units, each pressure sensing unit of the plurality of pressure sensing units comprises a plurality of sub-pressure sensing units, a first sub-pressure sensing unit of the plurality of sub-pressure sensing units has a longest dimension extending in a first direction, a second sub-pressure sensing unit of the plurality of sub-pressure sensing units has a longest dimension extending in a second direction different than the first direction, and there is a differential output between the plurality of sub-pressure sensing units; and a heat treatment layer disposed on at least one side of the force sensing layer and configured to direct heat away from the force sensing layer, wherein:

the heat treatment layer is spaced apart from the force sensing layer by a protection layer, and the force sensor device is disposed between the OLED layer and the CPU element.

12. The OLED display device of claim 11, further comprising:

a touch panel, wherein the OLED layer is disposed between the touch panel and the force sensor device.

13. The OLED display device of claim 11, further comprising:

a touch electrode layer, wherein:

the touch electrode layer is configured to sense a touch position, and the touch electrode layer is embedded in the OLED layer.

14. The OLED display device of claim 11, wherein:

the force sensing layer comprises a first pressure sensing unit and a second pressure sensing unit, and the protection layer is disposed between the first pressure sensing unit and the second pressure sensing unit and above the first pressure sensing unit and the second pressure sensing unit.

15. A force sensor device, comprising:

a force sensing layer, wherein:

the force sensing layer comprises a plurality of pressure sensing units, each pressure sensing unit of the plurality of pressure sensing units comprises a plurality of sub-pressure sensing units,
a first sub-pressure sensing unit of the plurality of sub-pressure sensing units has a longest dimension extending in a first direction,
a second sub-pressure sensing unit of the plurality of sub-pressure sensing units has a longest dimension extending in a second direction different than the first direction, and
there is a differential output between the plurality of sub-pressure sensing units;
a first heat treatment layer disposed on at least one side of the force sensing layer and configured to direct heat away from the force sensing layer; and
a second heat treatment layer, wherein the force sensing layer is disposed between the first heat treatment layer and the second heat treatment layer.

16. The force sensor device of claim 15, wherein at least one of the first heat treatment layer or the second heat treatment layer is selected from a group consisting of graphite sheets, graphene sheets, and copper sheets.

17. The force sensor device of claim 15, wherein at least one of the first heat treatment layer or the second heat treatment layer is grounded to function as a signal mask layer.

18. The force sensor device of claim 15, further comprising:
an adhesive layer disposed between the force sensing layer and the first heat treatment layer, wherein:
the force sensing layer comprises a first pressure sensing unit and a second pressure sensing unit, and
a gap is defined by the first pressure sensing unit, the second pressure sensing unit, and the adhesive layer.

19. The force sensor device of claim 15, further comprising:
a substrate disposed between the force sensing layer and the second heat treatment layer.

20. The force sensor device of claim 11, wherein:
each of the plurality of sub-pressure sensing units consists of four sub-pressure sensing units,
each of the four sub-pressure sensing units defines a resistor,
each of the four sub-pressure sensing units has a same electrical resistance,
the four sub-pressure sensing units construct a Wheatstone bridge,
the first sub-pressure sensing unit and a third sub-pressure sensing unit of the four sub-pressure sensing units have a longest dimension extending in the first direction, and
the second sub-pressure sensing unit and a fourth sub-pressure sensing unit of the four sub-pressure sensing units have a longest dimension extending in the second direction.

* * * * *